(12) United States Patent
Allibert et al.

(10) Patent No.: US 7,476,930 B2
(45) Date of Patent: Jan. 13, 2009

(54) MULTI-GATE FET WITH MULTI-LAYER CHANNEL

(75) Inventors: Fréderic Allibert, Grenoble (FR); Takeshi Akatsu, Saint Nazaire les Eymes (FR); Bruno Ghyselen, Seyssinet-Pariset (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 11/773,816

(22) Filed: Jul. 5, 2007

(65) Prior Publication Data

US 2007/0257301 A1   Nov. 8, 2007

Related U.S. Application Data

(63) Continuation of application No. PCT/EP2006/050691, filed on Feb. 6, 2006.

(30) Foreign Application Priority Data

Feb. 4, 2005   (FR) ................... 05 01129

(51) Int. Cl.
H01L 29/772 (2006.01)
(52) U.S. Cl. ................ 257/327; 257/347; 257/E29.264
(58) Field of Classification Search ................ 257/315, 257/19, E29.264
See application file for complete search history.

(56) References Cited

U.S. PATENT DOCUMENTS

| 5,461,250 | A | 10/1995 | Burghartz et al. | 257/347 |
|---|---|---|---|---|
| 6,495,403 | B1 | 12/2002 | Skotnicki et al. | 438/157 |
| 6,713,810 | B1* | 3/2004 | Bhattacharyya | 257/315 |
| 7,154,118 | B2* | 12/2006 | Lindert et al. | 257/66 |
| 7,193,279 | B2* | 3/2007 | Doyle et al. | 257/401 |
| 7,323,710 | B2* | 1/2008 | Kim et al. | 257/19 |
| 2003/0227036 | A1* | 12/2003 | Sugiyama et al. | 257/288 |
| 2005/0023610 | A1* | 2/2005 | Ghyselen et al. | 257/347 |
| 2005/0116218 | A1* | 6/2005 | Yang | 257/19 |

FOREIGN PATENT DOCUMENTS

EP   0 587 520 B1   2/1998
WO   WO 2004/006326 A   1/2004

OTHER PUBLICATIONS

J.P. Colinge et al., "Silicon-On-Insulator Gate-All-Around Device", IEDM 90 Tech. Digest, pp. 595-598, (1990).

(Continued)

Primary Examiner—Stephen W Smoot
(74) Attorney, Agent, or Firm—Winston & Strawn LLP

(57) ABSTRACT

The invention concerns a field-effect transistor with a drain, a source, a channel in electrical contact with the source and the drain, and at least one gate, so as to apply an electric field to the channel when each gate is polarized, where the channel has a multi-layer structure with at least three layers, and with at least one of the layers of the multi-layer structure having electrical properties that are substantially different from those of another layer of the multi-layer structure, and wherein a single gate or two gates are arranged substantially perpendicular to a reference plane of the channel defined by an interface plane between two layers of the multi-layer structure.

18 Claims, 6 Drawing Sheets

OTHER PUBLICATIONS

H.-S. P. Wong, "Beyond The Conventional Transistor", IBM Journal of Research & Development, vol. 46, No. 2/3, (2002).

Q. YTong et al., "Semiconductor Wafer Bonding: Science and Technology", The Electrochemical Society; 1-99, (1999).

Friedrich Schaffler, "High-Mobility Si And Ge Structures", Semicond. Sci. Technol., vol. 12, pp. 1515-1549 (1997).

* cited by examiner

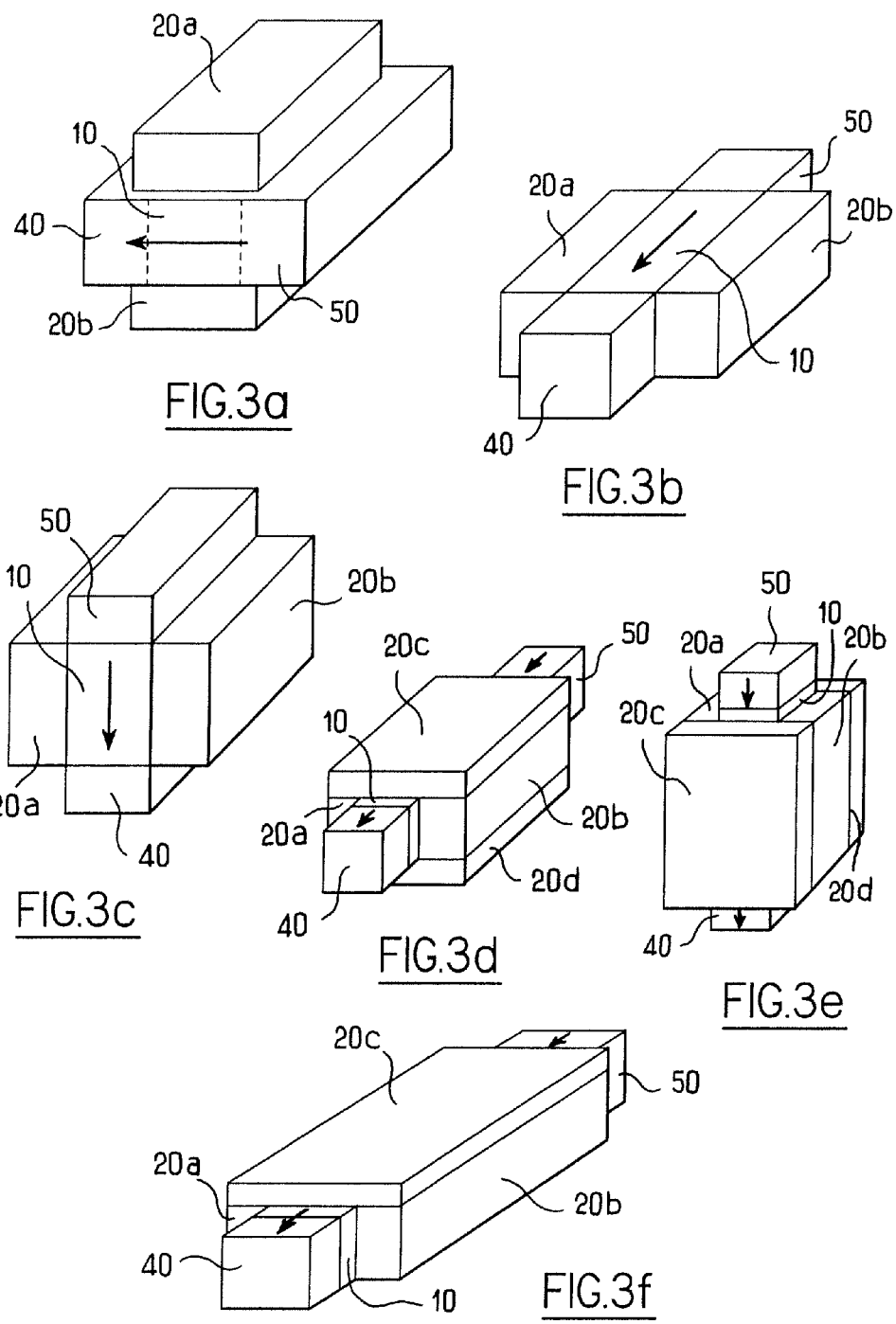

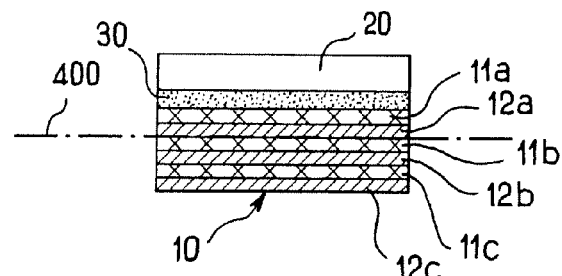
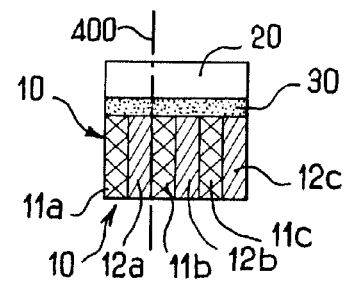
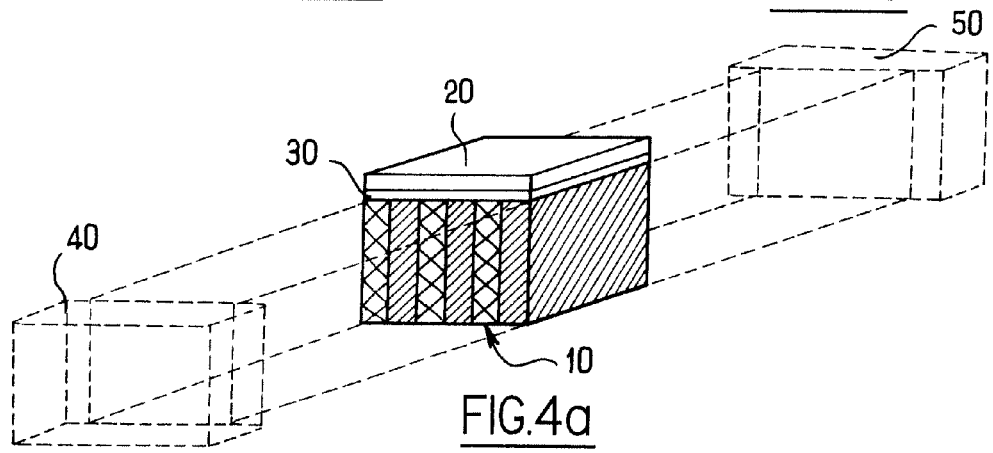
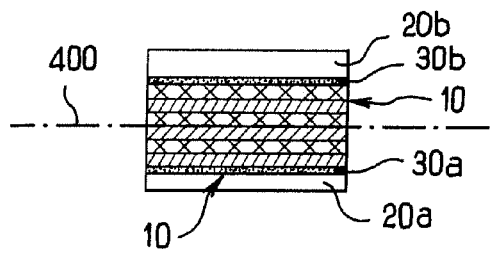
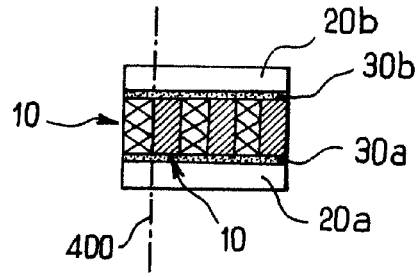
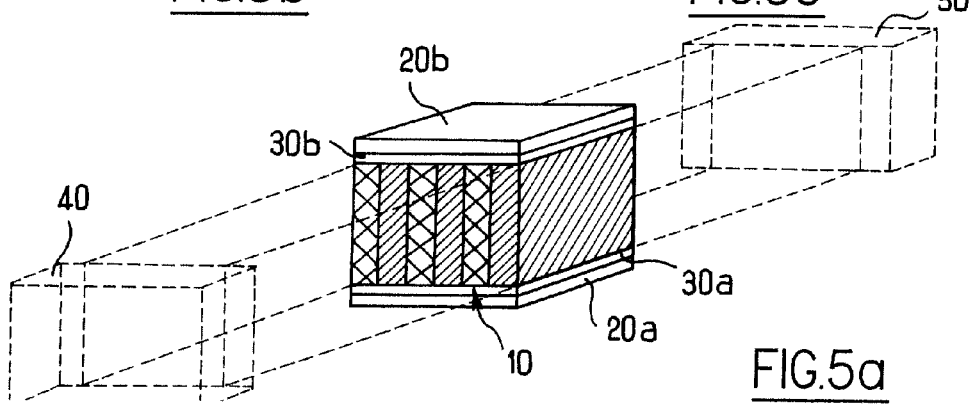

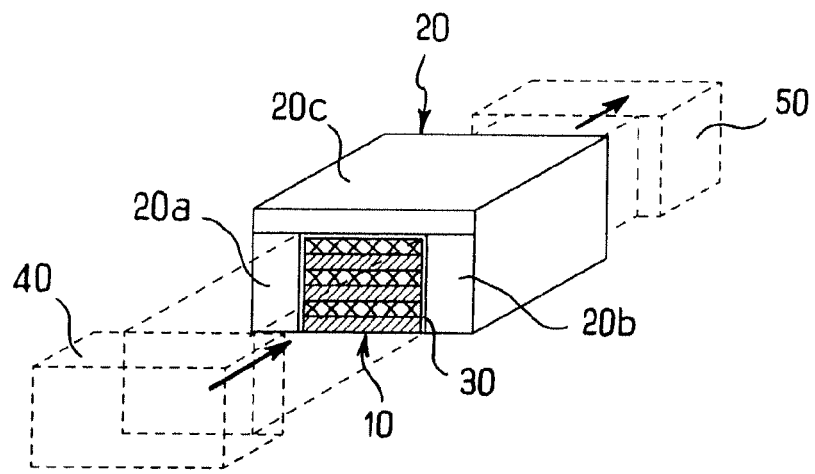
FIG.6a
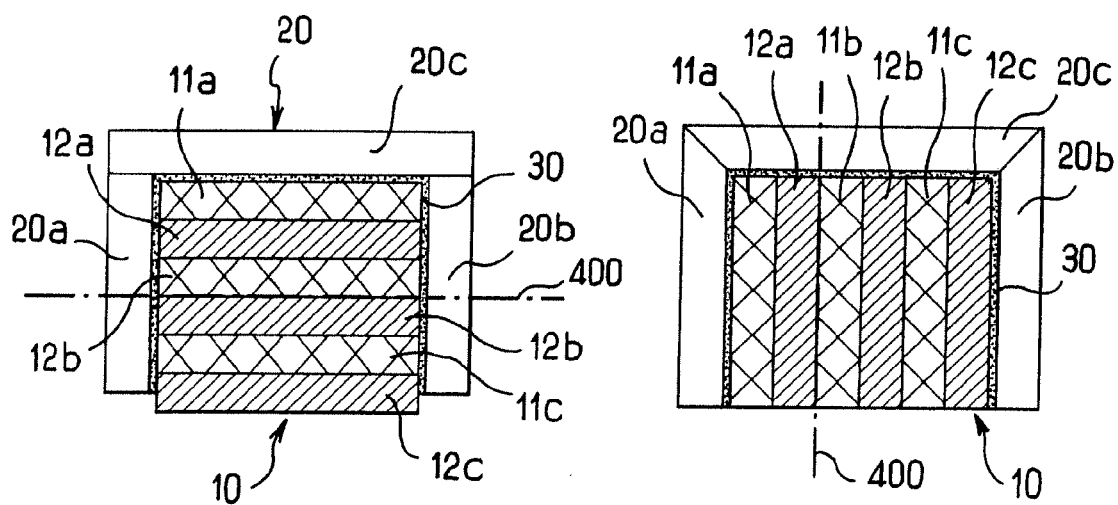
FIG.6b
FIG.6c

MULTI-GATE FET WITH MULTI-LAYER CHANNEL

CROSS-REFERENCE TO RELATED APPLICATIONS

This application is a continuation of International application no. PCT/EP2006/050691 filed Feb. 6, 2006, the entire content of which is expressly incorporated herein by reference thereto.

BACKGROUND

The invention concerns a single-gate or multiple-gate field-effect transistor (FET).

A bulk single-gate FET and a single-gate FET of the semiconductor-on-insulator type, respectively, are shown in longitudinal cross-section in FIGS. 1a and 1b, each having a source 40 and a drain 50 separated by a thickness of material with appropriate physical and electrical properties for the creation of an active channel between the source 40 and the drain 50 when the transistor is polarised, and a gate 20 located above the aforementioned thickness of material, and separated from this thickness of material by a fine layer of dielectric material so that, when the gate 20 is polarised, the electric field is applied to the thickness of material in a direction that is substantially perpendicular to the general plane of the dielectric layer 30, with the layer of dielectric material 30 thus creating a capacitance whose dielectric constant is that of the dielectric concerned ($SiO_2$, for example). Here, the single-gate FET is supported by a stiffening substrate 300 which is used in particular of give mechanical strength to the assembly. In a possible alternative, as illustrated in FIG. 1b, a thick layer 200 of dielectric material is inserted between the stiffening substrate 300 and the single-gate FET, mainly to improve the electrical properties of the transistor, the latter then becoming a single-gate FET-on-insulator. Polarisation of the gate 20, and of the source 40 and the drain 50 will then create a zone of accumulation of the charge carriers, forming an active channel between the source 40 and the drain 50 when this polarisation is direct and is greater than a determined voltage threshold, as well as a zone of inversion of the charge carriers in the part located under the channel. The single-gate FET is then conducting.

Regarding the multi-gate FETs, these have experienced considerable success in recent years because of the many advantages that they have, in particular in relation to the single-gate FETs, such as a reduction in short-channel effects (SCE), a gradient under the steep threshold, lack of body effect, and lower or even zero doping. These advantages are mainly brought about by the particular configuration of a multi-gate FET, which has a narrow active channel (separating the source from the drain) capable of being separated electrically from the bulk substrate.

A double-gate FET is illustrated in longitudinal cross-section and in cross-section in FIGS. 2a and 2b, respectively. This component has a source 40 and a drain 50 connected together electrically by an active channel 10, and two gates 20a and 20b located on either side of the active channel 10 (the upper gate being called the front gate 20a and the buried gate being called the back gate 20b) so as to apply an electric field to the channel 10 when they are polarised. The front gate 20a and the back gate 20b are substantially parallel to each other in order to create an approximately symmetrical electric field along the channel and perpendicular to the reference plane of the channel 10, here defined by a plane lying between the channel 10 and one of the two gates 20a and 20b. The gates 20a and 20b are each separated from the channel 10 by a layer of dielectric material 30a and 30b, thus creating a capacitance whose dielectric constant is that of the dielectric (such as $SiO_2$). Here, the double-gate FET is supported by a stiffening substrate 300 which is used in particular to provide mechanical strength to the assembly. In a possible alternative, as illustrated in FIGS. 2a and 2b, a thick layer 200 of dielectric material is inserted between the stiffening substrate 300 and the double-gate FET, in particular to improve the electrical properties of the transistor, the latter then becoming a double-gate FET-on-insulator.

The application of two voltages, whether identical or not, $V_G$ and $V_G$, to each of the two gates 20a and 20b (according to a first configuration), or the application of a voltage, $V_G$, to the front gate 20a and a connection to earth of the back gate 20b (in a second configuration) will then create at least one charge carrier accumulation zone or charge carrier inversion zone in the channel 10. From a threshold voltage, $V_S$, applied to the gates 20a and 20b, a current will be able to flow between the source 40 and the drain 50 by means of the channel 10, the double-gate FET then being conducting.

Different designs of multi-gate FET are illustrated in FIGS. 3a to 3f. These are familiar to the previous designs. Note that, in order to simplify the explanation, these Figures show only the channel 10, the source 40, the drain 50 and the gates. The arrow appearing in each of the different Figures represents the direction of the current in the channel 10 (when $V_G > V_S$). Here, the support substrate is assumed to be located under the FETs shown.

FIG. 3a shows a double-gate planar FET whose gates 20a and 20b lie in parallel and on either side of the planes in which the current is flowing in the channel 10, with the FET here lying along its support substrate.

FIGS. 3b and 3c illustrate the double-gate FETs, in which the gates 20a and 20b lie in parallel and on either side of the flow planes of the current, with the FET of FIG. 3b extending in length in a direction that is substantially parallel to the surface of the support substrate, and the FET of FIG. 3c extending in length in a direction approximately perpendicular to the surface of the support substrate.

FIG. 3d represents a four-gate FET 20a, 20b, 20c, 20d, with the latter completely surrounding at least one part of the channel 10 along its length. This FET is also known as the GAA-FET (Gate-All-Around FET).

FIG. 3e represents a four-gate GAA-FET 20a, 20b, 20c and 20d, with the latter completely surrounding at least one part of the channel 10, and with the FET here being placed more vertically in relation to the substrate than the FET of FIG. 3d.

FIG. 3f represents a FET called the Fin-FET, with three gates, the latter surrounding at least one part of the channel 10, two gates 20a and 20b extending in current flow planes as well as along the length of the channel 10.

Compared to single-gate FETs, the multi-gate FETs can attain transconductances that are twice as high, thanks to the particular properties of a narrow channel 10 surrounded by at least two gates. Despite the current performance of single- or multi-gate FETs, it would be desirable to increase the current within the channel 10. To this end, one could increase the section of the channel 10. However, with an excessively high thickness of the channel 10, the conventional gate or gates (as shown, for example, in FIGS. 1a and 3a to 3f) would not apply a sufficient field to cause an accumulation of all the charges in the channel 10. It is then not possible to take advantage of all of the mobile charges that may exist in such a thick channel 10.

Another tested solution is to have different structures of channel 10 such as a channel 10 in elastically stressed Si (thus having a substantially greater charge mobility in relation to elastically relaxed silicon) or stressed Si structures in SiGe, or a stressed SiGe structure in relaxed Si. However, these few channel structure proposals 10 can be implemented only at very thin channel thicknesses, because the layers of stressed material must not exceed a critical thickness beyond which the stresses lose their essentially elastic character. The magnitude of the current therefore remains very limited.

SUMMARY OF THE INVENTION

The present invention now provides an increase in the mobility of the charges in the channel of a single-gate or multi-gate FET in relation previous designs. In particular, a thicker channel is used in an optimal manner by virtue of a particular design of the gates.

In a first aspect, the present invention relates to a first field-effect transistor having a drain, a source, a channel in electrical contact with the source and the drain, and a single gate, so as to apply an electric field to the channel when the gate is polarised, where the channel has a multi-layer structure with at least three layers, and with at least one of the layers of the multi-layer structure having electrical properties that are substantially different from those of another layer of the multi-layer structure, characterised in that the single gate is substantially perpendicular to the reference plane of the channel defined by an interface plane between two layers of the multi-layer structure.

According to a second aspect, the invention relates to a field-effect transistor having a drain, a source, a channel in electrical contact with the source and the drain, and at least two gates, so as to apply an electric field to the channel when each gate is polarised, where the channel has a multi-layer structure with at least three layers, and with at least one of the layers of the multi-layer structure having electrical properties that are substantially different from those of another layer of the multi-layer structure, characterised in that two gates are substantially perpendicular to the reference plane of the channel defined by an interface plane between two layers of the multi-layer structure.

BRIEF DESCRIPTION OF THE DRAWINGS

Other aspects, embodiments and advantages of this present invention will appear more clearly on reading the following detailed description in which the devices and processes according to the invention are presented, given by way of non-limited examples and with reference to the appended drawings in which:

FIGS. 3a to 3f diagrammatically show different designs of multi-gate FET.

FIGS. 4a, 4b and 4c show single-gate FETs according to the invention, respectively in a perspective view by transparency, a view in cross section to the channel with a first channel configuration, and a view in cross section to the channel with a second channel configuration.

FIGS. 5a, 5b and 5c show double-gate FETs according to the invention, respectively in a view in perspective by transparency, a view in cross section to the channel with a first channel configuration, and a view in cross section to the channel with a second channel configuration.

FIGS. 6a, 6b and 6c show a Fin-FET according to the invention, respectively in a view in perspective by transparency, a view in cross section to the channel with a first channel configuration, and a view in cross section to the channel with a second channel configuration.

DETAILED DESCRIPTION OF THE PREFERRED EMBODIMENTS

Figure 1A:
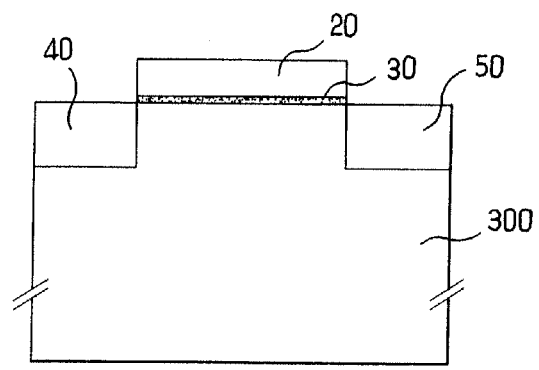
FIGS. 1a and 1b diagrammatically show, respectively, a view in longitudinal cross-section of a single-gate bulk FET and of a single-gate FET-on-insulator.
Figure 1B:
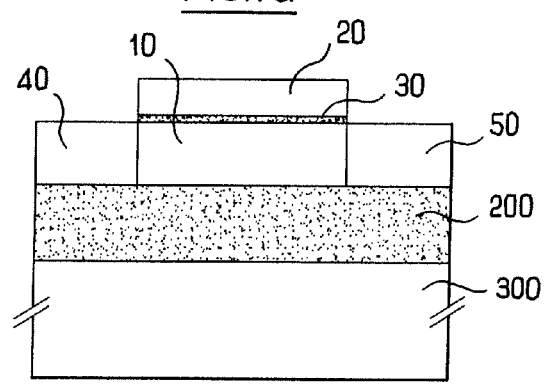
Figure 2A:
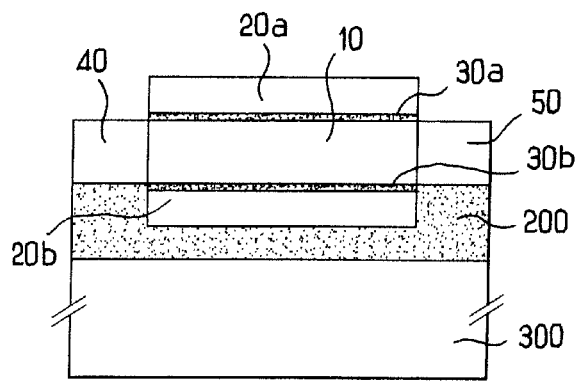
FIG. 2a and FIG. 2b diagrammatically show, respectively, a view in longitudinal and in transversal cross-sections of a double-gate FET.
Figure 2B:
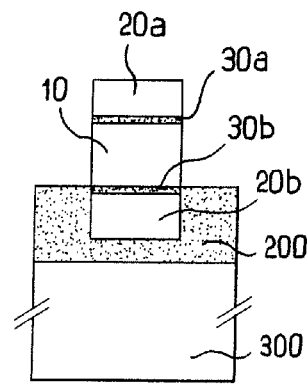

In general, other characteristics of the field-effect transistor according to the first or second embodiments of the invention are as follows:
- the multi-layer structure has at least two elastically stresses layers, each having a thickness that is less than the critical thickness, beyond which the stress would no longer be essentially elastic;
- the sum of the thicknesses of the stressed layers in the channel is greater than the critical thickness;
- the channel also has an intermediate layer with two stressed layers, capable of maintaining the elastic stresses in the two stressed layers;
- the stressed layers are in silicon;
- the intermediate layer is in $Si_{1-x}Ge_x$, with $x \in ]0;1]$;
- the stressed layers are in $Si_{1-x}Ge_x$, with $x \in ]0;1]$;
- the intermediate layer is in $Si1-yGey$, with $y \in [0;1]$ and with $y \neq x$;
- at least one layer of the channel is doped so as to influence the passage of charge carriers in some layers rather than in others in the channel when the gates are polarised and when the source and the drain have voltage applied.

Particular characteristics of the field-effect transistor according to the second embodiment of the invention are as follows:
- the transistor has at least two gates, located on either side of the channel;
- the transistor also has a third gate extending in a plane that is substantially perpendicular to the other two gates;
- the transistor has four gates completely surrounding at least one part of the channel;

FIGS. 4a, 4b, 4c, 5a, 5b, 5c, 6a, 6b, 6c and 7, are examples of single-gate and multi-gate FETs according to the invention. These FETs therefore each have a drain 40, a source 50, located respectively at the extremity of the channel 10 so as to be in electrical contact with the latter, and at least one gate (20, 20a, 20b, 20c and/or 20d). The channel 10 is separated from each gate by a dielectric layer (30, 30a or 30b) composed of a dielectric material.

The source 40, drain 50, channel 10 and gate(s) have a geometry, are dimensioned, and are designed so as to satisfy the technical specifications required by in the specification schedule of the transistor (electrical and thermal properties, current density, threshold voltage $V_S$, etc.). In this regard, reference can be made to the document entitled "Beyond the conventional transistor" by H.-S. P. Wong (IBM Journal of Research & Development, Vol. 46 No. 2/3, of March/May 2002). It is preferable that the channel 10 should be mainly in a material or materials chosen from among the semiconductor class of materials.

The channel 10 has a multi-layer structure with at least three layers, with at least one of the layers of the multi-layer structure having electrical properties that are substantially different from those of another layer of the multi-layer structure.

For illustration, referring to FIGS. 4a, 4b, 4c, 5a, 5b, 5c, 6a, 6b, 6c, 7, the channel 10 is formed from a 6-layer structure referenced as 11a-12a-11b-12b-11c-12c respectively. This structure has an alternation of layers of a first type (layers whose references include the number 11), and layers of a second type (layers whose references include the number 12). The first type of layer has the electrical properties that are substantially different from those of the second type of layer.

The differences of electrical properties can be obtained, for example, by at least one of the following means, taken alone or in combination: different doping from one layer to the next, different materials chosen from one layer to the next, an intrinsic structural difference from one layer to the next, different internal elastic stresses from one layer to the next, differences of crystallographic orientation from one layer to the next, differences of thickness from one layer to the next, different default crystalline concentrations from one layer to the next, or different impurities from one layer to the next.

In this way, according to one of the aforementioned scenarios, it is possible to have layers 11a-11b-11c in an elastically relaxed material, and layers 12a-12b-12c in an elastically stressed material. For example, it is thus possible to choose to create layers 11a-11b-11c in relaxed $Si_{1-x}Ge_x$ ($x\in[0;1]$) and layers 12a-12b-12c in elastically stressed $Si_{1-y}Ge_y$ ($y\in[0; 1]$ and $y\neq x$). More particularly, it is possible, for example, to choose to create layers 11a-11b-11c in relaxed $Si_{1-x}Ge_x$ ($x\in]0;1]$) and layers 12a-12b-12c in elastically stressed Si.

In a particular configuration, the relaxed layers 11a-11b-11c have a thickness that is sufficient to maintain the elastic stresses in the stressed layers 12a-12b-12c, that is to impose upon them a mesh parameter, and therefore to at least have the function of stabilising the elastic stresses. The level of elastic stresses in layers 12a-12b-12c is therefore dependent on the material chosen to constitute layers 11a-11b-11c.

Furthermore, an elastically stressed layer can preserve its stress only if its thickness remains less than a specified critical thickness (beyond which the layer is no longer essentially elastically stressed). Now this critical thickness reduces when the level of elastic stresses increases. However, as has been seen in the preceding paragraph, this elastic stress is dependent upon the material chosen to be stressed.

Thus, returning to the example of layers 11a-11b-11c in relaxed $Si_{1-x}Ge_x$ and of layers 12a-12b-12c in stressed $Si_{1-y}Ge_y$, the greater |y-x| (i.e. the greater the difference of concentration in Ge between the layers is), then the more the critical thickness of each of layers 12a-12b-12c will reduce. Reference can be made, for example, to the document entitled "High-mobility Si and Ge structures" by Friedrich Schäffler ("Semiconductor Science Technology" 12 (1997) 1515-1549) to ascertain the critical thicknesses in such cases. One advantage of such a multi-layer structure is to increase the total thickness of stressed material in the channel 10, in relation to a channel 10 including only one stressed layer.

In one preferred case, the sum of the thicknesses of the different stressed layers (12a-12b-12c) is greater than the critical thickness of each of these stressed layers. This multi-layer structure thus enables us to obtain a channel 10 with a total thickness of stressed material that is greater than the critical thickness of each of the stressed layers. This configuration can be very profitable in improving the performance of the FET concerned, in the case where the presence of stress in the channel 10 tends to improve the electrical properties of the latter.

This is the case in particular when stressed layers 12a-12b-12c are in Si or $Si_{1-y}Ge_y$, since the Si elastically stressed in tension has more mobile charges than those of the elastically relaxed Si (the forbidden band being smaller in fact). In relation to a channel 10 that has the same quantity of Si but relaxed, the channel 10 according to the invention therefore has a greater electrical yield (i.e. for a FET with the same configuration and voltages, $V_G$, of the same value, the current will be greater). And the fact that a FET according to the invention enables one to exceed the critical thickness of the Stressed Si by virtue of its multi-layer structure, therefore removes the limits usually encountered with Stressed Si, imposed by the critical thickness.

In operation, it is possible to confine the flow of the current in the stressed Si, since it is then possible to contain the current in layers close to the gates (in order to achieve a greater effect from the electric field applied by the latter). In operation, and alternatively, it is possible to select the materials of the different layers so as to force the flow of a type of carrier (hole or electron) into one layer, and that of the other type of carrier into another layer, so as to obtain a similar mobility for the two types of carrier. For example, it is possible to choose to cause the electrons to flow in layers 12a-12b-12c of stressed Si, and holes in layers 11a-11b-11c of relaxed $Si_{1-x}Ge_x$. Such a multi-layer structure can be created with approximate alternation of relaxed and stressed layers. Such a multi-layer structure can be created with varying thicknesses of stressed layers (in particular by manipulating the concentrations (x) of Ge in the adjacent layers in order to modify the critical thickness). Conventional gate designs (as illustrated in FIGS. 3a to 3e) are therefore not necessarily applicable to a multi-gate FET according to the invention.

FIGS. 4a and 5a provide a view in perspective of the single and double-gate FETs respectively, in isolation from their substrates, each including a source 40, a drain 50, a channel 10, a gate 20 or gates 20a-20b and a dielectric 30 or dielectrics 30a-30b. FIGS. 4b-4c and 5b-5c, provide views in cross section at the channel 10 of different configurations of single and double gate FETs respectively. The FET can be directly in contact with the bulk substrate that supports it in the case of a single-gate FET (not shown), or the FET can be separated electrically from the bulk substrate that supports it by a thick layer of dielectric material in the case of a double-gate FET (not shown).

Referring to FIGS. 4b and 5b, a first configuration of FET according to the invention is illustrated there. This first configuration consists of having the gate 20 of a single-gate FET (referring to FIG. 4a) or the two gates 20a-20b of a double-gate FET (referring to FIG. 5a) lying parallel to the reference plane 400 of the channel 10, the reference plane 400 being defined by an interface plane between two layers of the channel 10.

Referring to FIGS. 4c and 5c, a second configuration of the FET according to the invention is illustrated there. This second configuration consists of having the gate 20 of a single-gate FET (referring to FIG. 4c) or the two gates 20a-20b of a double-gate FET (referring to FIG. 5c) lying perpendicular to the reference plane of the channel 10.

In the case of a double-gate FET with the second configuration (see FIG. 5c), it is possible to arrange that the distance separating the two gates 20a and 20b (as well as the width of the channel 10) should be reduced so that the core of the channel 10 can sense the electric field (applied by the polarised gates) to an extent that is sufficient for electrical charges to be created there. It is thus possible, for example, to obtain a distance between the two gates 20a and 20b of about 15 nm. In particular, it is possible to reduce this distance sufficiently to work in volumic inversion. It is thus possible, for example, to obtain an inter-gate distance 20a-20b of about 10 nm.

Referring to FIGS. 6a and 6b, a third configuration of the FET according to the invention is illustrated there. This FET is of the triple-gate type (and is also called a Fin-FET), a third gate 20c being added perpendicular to the two gates 20a and 20b of the double-gate FET according to the second configuration (referring to FIG. 5c). There are two gates 20a and 20b lying perpendicular to the reference plane 400 of the channel 10 and one gate 20c lying parallel to the reference plane 400 of the channel 10. When this third gate 20c is joined to the two first gates 20a and 20b, a U-shaped gate unit 20 extending over a certain length of the channel 10 is thus obtained.

Referring to FIG. 6c, a fourth configuration of the FET according to the invention is illustrated there. This FET is of the triple-gate type (and is also called a Fin-FET), a third gate 20c being added perpendicular to the two gates 20a and 20b of the double-gate FET according to the first configuration (referring to FIGS. 5a and 5b). So two gates 20a and 20b lying parallel to the reference plane 400 of the channel 10 and one gate 20c lying perpendicular to the reference plane 400 of the channel 10 are provided. When this third gate 20c is joined to the first two gates 20a and 20b, a U-shaped gate unit 20 lying over a certain length of the channel 10 is obtained.

Figure 7:
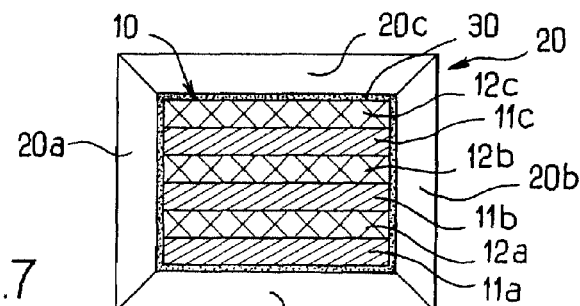
FIG. 7 shows a view in cross section of a GAA-FET according to the invention.

Referring to FIG. 7, a fifth configuration of the FET according to the invention is illustrated there. This FET is of the four-gate type (and is also called a GAA-FET). These four gates 20a, 20b, 20c and 20d entirely surround at least one part of the channel 10, so as to form a unit 20 of substantially rectangular section extending over a certain length of the channel 10.

This gate unit 20 is separated from the channel 10 by a dielectric layer 30.

Referring to FIGS. 4a, 4b, 4c, 5a, 5b, 5c, 6a, 6b, 6c, and 7, the material chosen for the gate or gates 20, 20a, 20b, 20c, and/or 20d can be polysilicon, or a metal alloy (such as an alloy containing Ti, Ni, or TiN) or even a conducting material, having a work function matched to the channel 10 according to the invention.

The gate or gates can lie along the whole length of the channel 10 or on one part only of its length, as well as over the full width of the channel 10 or only a part of this width.

A dielectric layer 30 or 30a-30b, composed of a dielectric material, is located between the channel 10 and the gate or gates. The dielectric material chosen can, for example, be $SiO_2$, $Si_3N_4$, or $Si_xO_yN_z$. The dielectric material can also be chosen so as to obtain a high dielectric constant, such as a metallic oxide like $Ta_2O_5$, $TiO_2$, $ZrO_2$, $HfO_2$, $Y_2O_3$, $La_2O_3$, $Al_2O_3$ or $Gd_2O_3$ and their silicates. It is thus possible to increase the capacitance in relation to the more conventional dielectrics for a given thickness of dielectric layer 30 (which, allows the short-channel effect to be controlled and a high current to be achieved successfully by keeping a large number of induced charges in the channel 10 when $V_G$ falls). It is also possible to reduce the thickness of the dielectric layer 30 in relation to more conventional dielectric layers, and thus to reduce the dimensions of the FET. The thickness of the dielectric must nevertheless remain greater than a limit thickness beyond which tunnel currents appear, damaging the creation of the FET (for example, a dielectric layer 30 in $SiO_2$ has a typical limit thickness of about 0.8 nm).

The source 40 and the drain 50 can, for example, be in metallic silicide or in silicon, and furthermore can be doped substantially according to the envisaged application. An appropriate doping will be arranged so as to create electric barriers of varying magnitude between the channel 10 on the one hand and source 40 and drain 50 on the other, and so to obtain a threshold voltage, $V_S$, of greater or lesser magnitude respectively.

In addition to the different elements of the FET according to the invention (channel, gate(s), dielectric, source, and drain), a stiffening substrate 300 is advantageously included to support these elements, as shown in FIGS. 4b, 4c, 5b or 5c, for example.

According to a first configuration, the FET has been bonded to this stiffening substrate 300, the FET having been manufactured separately from the stiffening substrate 300 (which here is then a receiving substrate for the FET). Optionally, the FET is joined to the stiffening substrate 300 by means of a thick layer of dielectric material, such as $SiO_2$, $Si_3N_4$, or $Si_xO_yN_z$ (which has possibly acted as the bonding layer) thus separating it, at least electrically, from the stiffening substrate 300, and then constituting a FET-on-insulator.

According to a second configuration, the FET is joined to the stiffening substrate 300 at the level of the channel 10 (meaning that no gate is interposed between the channel 10 and the stiffening substrate 300), and the stiffening substrate 300 has also been used as a crystalline growth substrate for the formation of one or more layers of the channel 10, and/or the source 40, and/or the drain 50. It has been possible to achieve this crystalline growth selectively so as to be able to effect the growth of the different layers of the channel 10 simultaneously. A channel 10 having a reference plane 400 that is substantially perpendicular to the plane of the stiffening substrate 300 is provided. It is thus possible, for example, to create a FET according to FIG. 4c or 6c. In a variant, this crystalline growth is executed layer after layer. A channel 10 having a reference plane 400 that is substantially parallel to the plane of the stiffening substrate 300 is thus provided. It is thus possible, for example, to create a FET according to FIG. 4b or 6b.

The creation of a FET according to the invention includes the formation of the channel 10, at least one gate, a dielectric layer between the channel 10 and each gate, a source 40 and a drain 50 respectively at one end of the channel 10.

Formation of the channel includes the formation of a multi-layer structure that can be dimensioned to form the channel, with the successive layers of the multi-layer structure having layers of material chosen from among the semiconductor class of materials. The layers of the channel 10 are epitaxied from at least one initial crystalline substrate. This crystalline substrate can be a bulk substrate, such as Si or Ge.

This crystalline substrate can be a pseudo-substrate composed of a support substrate (typically bulk) and a buffer structure created by epitaxy on the support substrate. Such a buffer structure is conventionally formed from a single thick layer, or from a metamorphic structure (that is a structure with several successive layers so as to obtain its mesh parameter evolving gradually in thickness from the mesh parameter of the support substrate). A buffer structure can therefore particularly have as its function to match mesh parameters, and to confine defects so as to present a good crystallographic structure at the surface, with few or no defects. Thus, for example, it is possible to create a channel 10 that includes layers of stressed Si and SiGe, from a pseudo-substrate that includes a buffer structure in SiGe, with a concentration of Ge gradually increasing in thickness, epitaxied onto a support substrate in bulk Si.

Figure 8:
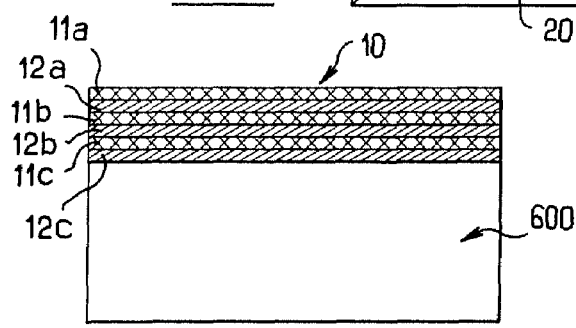
FIG. 8 shows a view in section, representing one stage in the creation of a multi-layer channel according to the invention, in accordance with a first method of implementation.

According to a first method of implementation of a channel 10 according to the invention, and referring to FIG. 8, successive crystalline growths of layers 11a, 12a, 11b, 12b, 11c, 12c of the multi-layer structure 10 are created from the crystalline substrate 600. To this end, epitaxy techniques by deposition in the vapour phase (also called CVD techniques), such as PECVD, MOCVD, LPCVD, and so on can be employed. The thicknesses and possibly the levels of doping will have to be controlled in particular, so as to arrive at the desired electrical properties.

According to a second method of implementation of a channel 10 according to the invention, (not shown), at least one crystalline growth of a layer is carried out from a crystalline substrate, this layer being intended to constitute one of the layers of the future multi-layer structure of the channel 10, with the epitaxy techniques that can be used for this purpose being substantially identical to those used for the first method of implementation. Bonding of this layer with a receiving substrate, and then later removal of the crystalline substrate then follow. Advantageously, the bonding is carried out by means of at least one bonding layer in the form of a dielectric material ($SiO_2$, $Si_3N_4$, $Si_xO_yN_z$ or other) formed on at least one of the two surfaces to be bonded.

Removal of the crystalline substrate here only has the objective of detaching the thin layer epitaxied initially. It is thus possible to effect the transfer of a layer such as stressed Si or SiGe, in a manner that is identical to that described in document WO 04/006326, including the implantation of atomic species prior to the bonding below of the layer to be removed, then creating a fragility zone, a detachment after bonding at the level of this fragility zone, and then a final stage of selective etching of the part remaining above the thin epitaxied layer transferred.

To create the multi-layer structure of the channel 10, a multiplicity of these slices of thin layers is successively executed, alternating with the formation of a layer of dielectric material (such as $SiO_2$, $Si_3N_4$, or $Si_xO_yN_z$) so as to finally form a multi-layer structure 10 that has alternating layers 11a, 11b, 11c of sliced semiconductor material and layers 12a, 12b and 12c of formed dielectric material. The slices can be taken from separate crystalline substrates or from a single crystalline substrate, recycled after each slice so as to be able to supply a new layer for a fresh slice. It is also possible to form these layers of dielectric material 12a, 12b, 12c by deposition or by nitriding or oxidation methods for example (according to the dielectric chosen). After each slice and/or formation of the dielectric layer, it is possible to employ further surface finishing stages, such as polishing, chemical etching or sacrificial oxidation. Once the multi-layer structure 10 has been formed, selective etching can be performed if required, in order to achieve the desired dimensions of the channel.

Figure 9:
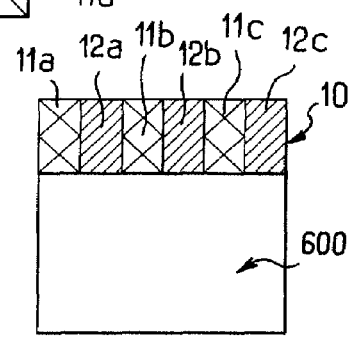
FIG. 9 shows a view in cross section of a FET representing a stage in the creation of a multi-layer channel according to the invention, in accordance with a second method of implementation.

According to a third method of implementation of a channel 10 according to the invention, and referring to FIG. 9, selective crystalline growths of layers 11a, 12a, 11b, 12b, 11c, 12c from a crystalline substrate 600 are employed for the creation of a multi-layer structure 10, with the height of the layers determining the length or the width of the future channel. To this end, epitaxy techniques by deposition in the vapour phase (also called CVD techniques), such as PECVD, MOCVD, LPCVD, etc. can be employed. The thicknesses in particular will have to be controlled so as to achieve the desired electrical properties.

In contrast to the multi-layer structure 10 obtained by the first or second method of implementation, here the geometry is entirely determined from the epitaxy (and does not necessarily require any later selective etching). Moreover, here the multi-layer structure is rotated by 90° in relation to the crystalline substrate, in comparison with the multi-layer structure 10 obtained by the first or the second method of implementation.

Whatever the method of implementation of the multi-layer structure chosen, it is possible, where necessary, to employ one or more stages of layer doping, so as to dope the layers of the channel 10 in a selective manner (that is some layers rather than others, by adapting the implantation energy) or in a non-selective manner, so as to attain certain electrical properties. The doping can possibly take place during the formation of the layers.

Figure 10A:
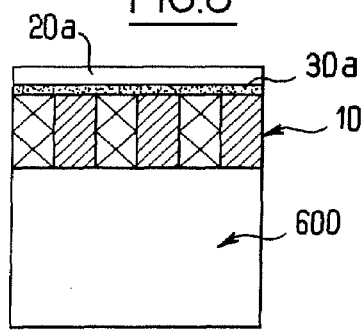
FIGS. 10a to 10e illustrate different stages in the creation of a FET according to the invention, with FIGS. 10a to 10c being views in cross section of the FET according to the associated stages, and FIGS. 10d and 10e being views in perspective of FET according to the associated stages.

Referring to FIG. 10a, the process includes an optional stage of gate formation 20a in an electrically conducting material and of a layer of dielectric material 30a located between the gate 20a and the multi-layer structure 10. These two layers can be formed initially by deposition for example. The thickness and the material of the dielectric are chosen to satisfy the electrical conditions set out in the specification schedule (value of the capacitance, minimum thickness from which tunnel currents occur, etc.). If the dielectric is $SiO_2$, a deposition of particles of $SiO_2$ or a thermal surface oxidation of the Si can be employed. Otherwise, the following techniques can be used: spraying, sol-gel processes, PVD ("physical vapor deposition"), MOCVD ("metal organic chemical vapor deposition"), or atomic layer deposition (ALD).

The gate 20a can be created in polysilicon or in a metal (alloy, aluminium, or other), or in another material that is an adequate electrical conductor for the FET concerned. The chosen techniques can include spraying, CVD or other.

Techniques for etching (after masking) of the dielectric layer 30a and of the gate 20a can then be employed as appropriate so as to fashion the latter according to a particular topography, in order to finally achieve a gate 20a of a particular length and width, especially in relation to the width and length of the multi-layer structure 10. The multi-layer structure 10 can also be etched so as to obtain a multi-layer structure 10 of specified length and width, to suit the desired dimensions of the channel to be formed, for example. If a source 40 and a drain 50 are formed at one end of this multi-layer structure 10, then a single-gate FET transistor is provided with the multi-layer structure 10 forming the channel.

Figure 10C:
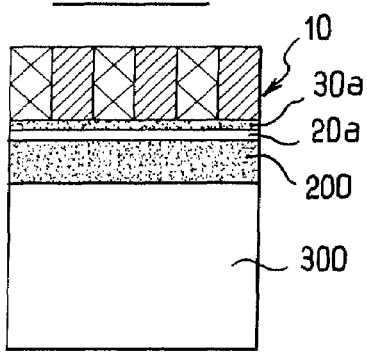

Referring to FIG. 10c, a further stage is included as an option, following on from creation of the multi-layer structure 10 according to one of the three previous methods, with this stage consisting of bonding the multi-layer structure 10 to a receiving substrate 300, followed by removal of the crystalline substrate 600 and possibly of part of the multi-layer structure 10. Removal of the crystalline substrate 600 can be carried out by the following processes, either alone or in combination: one or more suitable etching processes via the back of the substrate (the "etch-back" process), with mechanical and optionally chemical polishing, lapping, sacrificial oxidation, the Smart-Cut® procedure, etc. Bonding can be carried out by means of a bonding layer 200 made of a dielectric material, such as $SiO_2$, with a thickness that is sufficient to electrically isolate the receiving substrate 300 from the FET. It is thus possible to obtain a FET-on-insulator structure that is capable of improving performance. Suitable thermal treatments are then applied so as to join the whole together for the purpose of bonding. For the bonding process, reference can be made to "Semiconductor Wafer Bonding Science and Technology" (Q-Y. Tong and U. Gösele, a Wiley Interscience publication, Johnson Wiley & Sons, Inc.). In the case where a gate 20a has been formed on the multi-layer structure 10 (as shown in FIG. 10a) or on the receiving substrate 300 (by the formation of a gate 20a and then of a dielectric layer 30a), the structure shown in FIG. 10b, having a buried gate 20a, is provided.

Figure 10B:
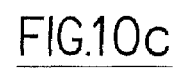

As an alternative to the stages represented in FIGS. 10a and 10b, it is possible to create not the two layers 30a and 20a on the donor substrate 600 (as shown in FIG. 10a), but the dielectric layer 30a on the donor substrate 600 and the gate 20a on the receiving substrate 300, before bonding these two assemblies at the level of the gate 20a to dielectric 30a interface in order to create the structure of FIG. 10b. Removal of the crystalline substrate 600 then allows us to arrive at the structure shown in FIG. 10c.

Figure 10D:
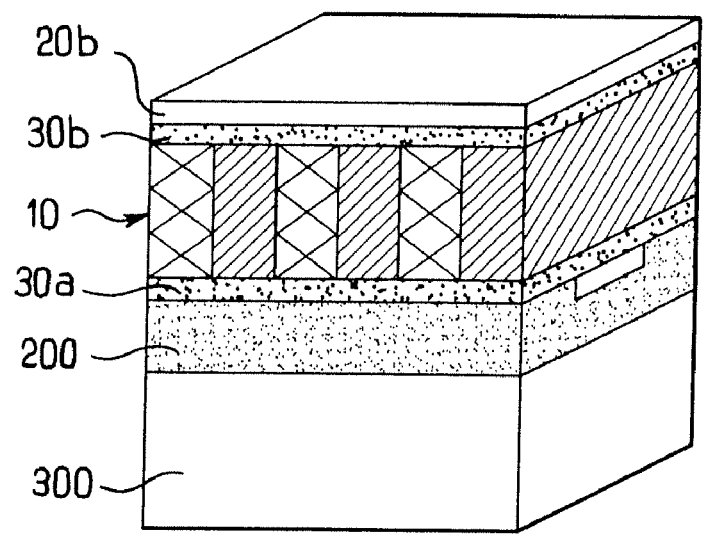

Referring to FIG. 10d, the process also has an optional stage for the formation of a layer of dielectric material 30b, and then of a gate layer 20b in electrically conducting material. These two layers 30b and 20b can, for example, be formed initially by deposition.

Figure 10E:
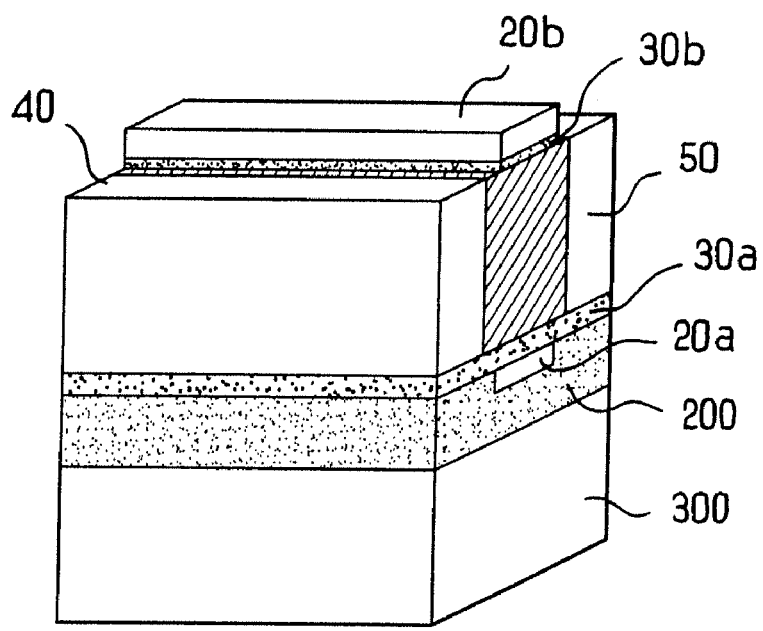

Referring to FIG. 10e, the channel 10, the gate 20b and the dielectric layer 30b can be fashioned by selective etching processes, to finally obtain to the wanted dimensions of the channel 10 (i.e. the multi-layer structure 10 thus created) and the gate 20b.

A narrow channel width 10 is recommended if one then wants to create gates alongside these layers (so that the voltage applied by the gates is able to reach the centre of the channel 10). It is thus possible, for example, to choose a channel width 10 of about 10 or 20 nm.

The formation of a source 40 and a drain 50 can be carried out later or following on from the formation of the channel 10 or the gates. It can include one or more stages of crystalline growths, and of the implantation stages (adapted for the creation of a specified electric barrier with the channel 10). This can be achieved using a siliconizing process, for example. In the case where a first buried gate 20a has been created between the receiving substrate 300 and the channel 10, a double-gate FET such as that shown in FIG. 10e is provided. Otherwise, a single-gate FET-on-insulator is provided, with the insulator being composed here of the dielectric layer 200 (not shown).

Referring to FIG. 10e, each gate 20a, 20b is formed in a plane that is substantially perpendicular to the reference plane 400 of the channel 10, since the channel 10 is composed here of "vertical" layers, namely layers perpendicular to the plane of deposition of the gates. This result is typically achieved with a multi-layer structure created according to the third method of implementation (shown in FIG. 9).

In a variant, each gate 20a, 20b is formed in a plan that is substantially parallel to the reference plane of the channel 10, since the channel 10 is composed here of "horizontal" layers, namely parallel to the plane of deposition of the gates. This result is typically achieved with a multi-layer structure created according to the first method of implementation (shown in FIG. 8 or the second method of implementation). Optionally, a third gate 20c may be formed, perpendicular to the extremity of the two gates 20a and 20b, in order to form a Fin-FET (see FIGS. 6a, 6b and 6c).

In a variant and optionally, a third gate 20c and a fourth gate 20d are formed, each respectively perpendicular to an extremity of the two gates 20a and 20b in order to former a GAA-FET (see FIGS. 6a, 6b and 6c).

In a variant, and in the case of manufacture of a Fin-FET (shown in FIGS. 6a, 6b or 6c), the gates 20a, 20b, 20c can be formed separately from the remainder of the transistor, and then assembled on the remainder of the transistor, by a bonding process for example. The bonding can then be performed by means of a bonding layer which then forms the dielectric layer 30 of the Fin-FET.

In a variant, and in the case of manufacture of a GAA-FET (shown in FIG. 7), it is possible to create the gate unit 20 firstly by etching of a traversing tunnel in the dielectric layer 200, meaning an etching process carried out under the already formed channel 10, and then by means of a conventional metallic deposition to be executed both in the tunnel and on the channel. In this context, reference can be made to the document entitled "Silicon-On-Insulator Gate-All-Around Device" by J. P. Colinge et al. (IEDM '90 Tech. Digest, p. 595, 1990) for more details.

Optionally, creation of the FET also includes a stage of bonding the transistor or a transistor part already created to a stiffening substrate by means of a layer of dielectric material with a thickness that is sufficient to protect the transistor from the effects of the bonding process, as well as to isolate the transistor electrically from the stiffening substrate. This results in a FET-On-Insulator structure.

Naturally, these implementation techniques include all other conventional stages for the creation of components (photolithography, etc.) necessary to obtain the desired component.

Other constituents can be added to the layers of semiconductor materials of the channel 10, such as carbon with a concentration of carbon in the layer concerned that is substantially equal to or less than 50%, or more particularly with a concentration that is less than or equal to 5%.

Finally, this present invention is not limited to a channel 10 in the IV or IV-IV materials described above, but also extends to other types of materials belonging to atomic families II, III, IV, V or VI and to alloys belonging to atomic families IV-IV, III-V, and I1-VI. Furthermore, the channel 10 can include intermediate layers of non-conducting or non-semiconductor materials, such as dielectrics.

It should also be the that in the case of alloy materials, the alloys chosen can be binary, ternary, quaternary or of higher degree.

What is claimed is:

1. A field-effect transistor comprising:
   a drain,
   a source,
   a channel in electrical contact with the source and the drain, the channel having a multi-layer structure comprising at least three layers defining substantially parallel planes, wherein one of the at least three layers has electrical properties that are substantially different from those of another one of the at least three layers, and
   at least two gates, each of the at least two gates being disposed substantially perpendicular to the substantially parallel planes defined by the at least three layers of the channel.

2. The field-effect transistor according to claim 1, which further comprises a third gate lying in a plane that is substantially perpendicular to the other two gates.

3. The field-effect transistor according to claim 1, comprising four gates arranged to completely surround at least a portion of the channel.

4. The field-effect transistor according to claim 1, wherein the multi-layer structure comprises at least two elastically stressed layers, each having a thickness that is less than the critical thickness beyond which the stress would no longer be essentially elastic.

5. The field-effect transistor according to claim 4, wherein the sum of the thicknesses of the stressed layers is greater than the critical thickness of each of the stressed layers.

6. The field-effect transistor according to claim 4, which further comprises an intermediate layer capable of maintaining the elastic stresses in the at least two elastically stressed layers.

7. The field-effect transistor according to claim 6, wherein the intermediate layer is in $Si_{1-x}Ge_x$, with $x \in ]0;1]$.

8. The field-effect transistor according to claim 6, wherein the intermediate layer is in $Si_{1-y}Ge_y$, with $y \in [0;1]$ and with $y \neq x$.

9. The field-effect transistor according to claim 4, wherein the at least two elastically stressed layers are silicon.

10. The field-effect transistor according to claim 9, wherein the intermediate layer is in $Si_{1-x}Ge_x$, with $x \in ]0;1]$.

11. The field-effect transistor according to claim 4, wherein the at least two elastically stressed layers are in $Si_{1-x}Ge_x$, with $x \in ]0;1]$.

12. The field-effect transistor according to claim 11, wherein the intermediate layer is in $Si_{1-y}Ge_y$, with $y \in [0;1]$ and with $y \neq x$.

13. The field-effect transistor according to claim 1, wherein at least one layer of the at least three layers of the channel is doped so as to influence charge carriers to pass in some layers rather than others when one or more of the at least two gates are polarised and voltage is applied to the source and the drain.

14. The field-effect transistor according to claim 1, wherein all layers of the multi-layer structure are parallel.

15. A field-effect transistor comprising:
   a drain,
   a source,
   a channel in electrical contact with the source and the drain, the channel having a multi-layer structure comprising at least three layers defining substantially parallel planes, wherein one of the at least three layers has electrical properties that are substantially different from those of another one of the at least three layers, wherein the multi-layer structure comprises at least two elastically stressed layers and an intermediate layer, each of the at least two elastically stressed layers having a thickness that is less than the critical thickness beyond which the stress would no longer be essentially elastic and the intermediate layer being adapted to maintain the elastic stress in the at least two elastically stressed layers, and
   at least two gates, each of the at least two gates being disposed substantially perpendicular to the substantially parallel planes defined by the at least three layers of the channel.

16. The field-effect transistor according to claim 15, wherein the stressed layers are silicon and the intermediate layer is in $Si_{1-x}Ge_x$, with $x \in ]0;1]$.

17. The field-effect transistor according to claim 15, wherein the stressed layers are in $Si_{1-x}Ge_x$, with $x \in ]0;1]$ and the intermediate layer is in $Si_{1-y}Ge_y$, with $y \in [0;1]$ and with $y \neq x$.

18. The field-effect transistor according to claim 15, wherein all layers of the multi-layer structure are parallel.

* * * * *